United States Patent
Tannhäuser et al.

(10) Patent No.: US 12,074,591 B2
(45) Date of Patent: Aug. 27, 2024

(54) METHOD FOR ACTUATING A SEMICONDUCTOR POWER SWITCH, ACTUATION CIRCUIT FOR A SEMICONDUCTOR POWER SWITCH, AND ELECTRONIC CIRCUIT BREAKER

(71) Applicant: Siemens Aktiengesellschaft, Munich (DE)

(72) Inventors: Marvin Tannhäuser, Hausen (DE); Fabian Döbler, Bayern (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/907,770

(22) PCT Filed: Nov. 22, 2021

(86) PCT No.: PCT/EP2021/082506
§ 371 (c)(1),
(2) Date: Aug. 29, 2022

(87) PCT Pub. No.: WO2022/135808
PCT Pub. Date: Jun. 30, 2022

(65) Prior Publication Data
US 2023/0344424 A1    Oct. 26, 2023

(30) Foreign Application Priority Data
Dec. 21, 2020   (DE) ...................... 10 2020 216 405.3

(51) Int. Cl.
*H03K 17/082*    (2006.01)
*H02H 9/00*    (2006.01)

(52) U.S. Cl.
CPC ......... *H03K 17/0822* (2013.01); *H02H 9/001* (2013.01); *H03K 2217/0009* (2013.01)

(58) Field of Classification Search
CPC ............ H02H 9/001; H02H 3/06; H02H 3/07; H02H 3/025; H02H 3/027; H02H 3/08; H03K 17/081–0828
See application file for complete search history.

(56) References Cited

U.S. PATENT DOCUMENTS

2005/0185353 A1    8/2005   Rasmussen et al.
2007/0247765 A1*  10/2007   Takahashi ............. H03K 17/18
                                                     361/18

(Continued)

FOREIGN PATENT DOCUMENTS

DE   102007018761 A1   12/2007
DE   102008018619 A1   10/2009

(Continued)

OTHER PUBLICATIONS

International Search Report for PCT/EP2021/082506, mailed on Mar. 3, 2022.

*Primary Examiner* — Jared Fureman
*Assistant Examiner* — Christopher J Clark
(74) *Attorney, Agent, or Firm* — Schmeiser, Olsen & Watts LLP

(57) ABSTRACT

A method for actuating a semiconductor power switch of an AC circuit is provided, which can be activated or deactivated by the semiconductor power switch. The method has the following steps: a) ascertaining the present current value and the present voltage value of the AC circuit; b) ascertaining whether the present current value exceeds a specifiable maximum value and if so, c1) generating an actuation signal for deactivating the current circuit, c2) generating an actuation signal for activating the current circuit within a period of time after generating the actuation signal for deactivating the current circuit, wherein the period of time is less than or equal to the period duration of the voltage, and c3) ascertaining whether the present current value exceeds a speci- (Continued)

fiable maximum value, which corresponds to the previous maximum value or is less than the previous maximum value, after activating the current circuit.

12 Claims, 2 Drawing Sheets

(56) References Cited

U.S. PATENT DOCUMENTS

| | | | |
|---|---|---|---|
| 2010/0328828 A1* | 12/2010 | Xu | H02H 3/0935 |
| | | | 361/59 |
| 2019/0123549 A1 | 4/2019 | Rodrigues et al. | |
| 2019/0326899 A1 | 10/2019 | Nakamura et al. | |

FOREIGN PATENT DOCUMENTS

| | | |
|---|---|---|
| EP | 2355353 A1 | 8/2011 |
| EP | 3379725 A1 | 9/2018 |
| JP | 2007236061 A | 9/2007 |

\* cited by examiner

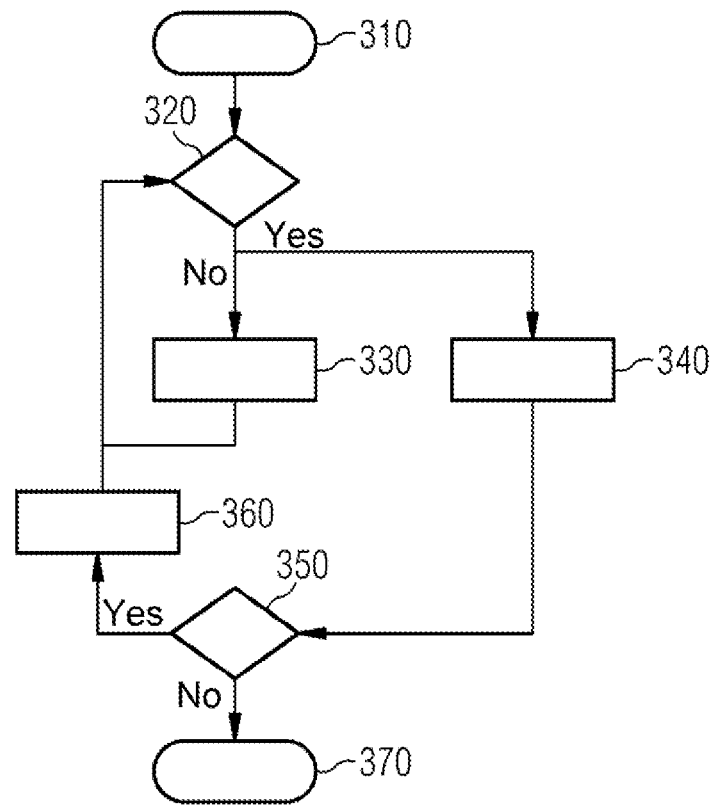
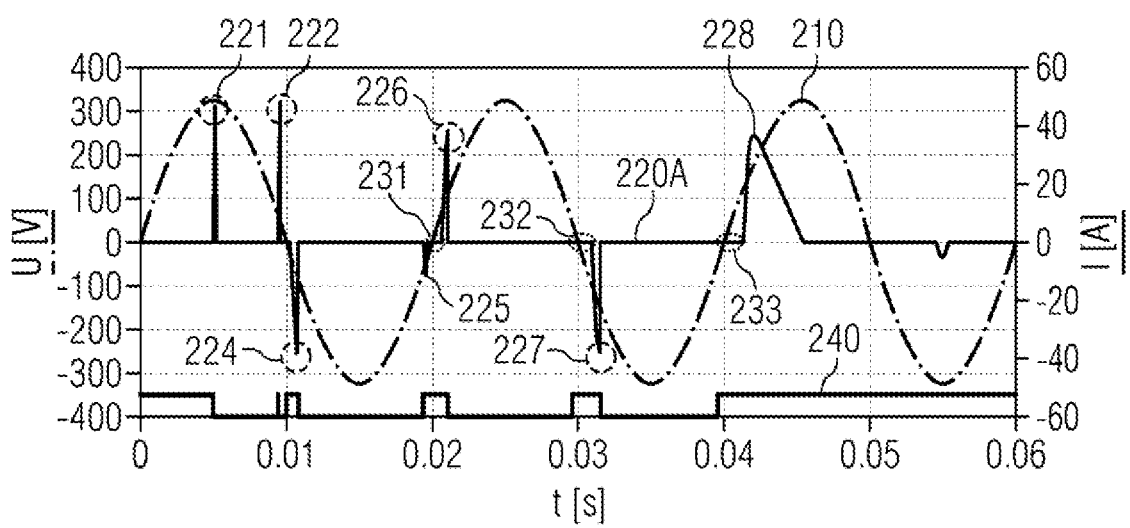

METHOD FOR ACTUATING A SEMICONDUCTOR POWER SWITCH, ACTUATION CIRCUIT FOR A SEMICONDUCTOR POWER SWITCH, AND ELECTRONIC CIRCUIT BREAKER

CROSS-REFERENCE TO RELATED APPLICATIONS

This application claims priority to PCT Application No. PCT/EP2021/082506, having a filing date of Nov. 22, 2021, which claims priority to DE Application No. 10 2020 216 405.3, having a filing date of Dec. 21, 2020, the entire contents both of which are hereby incorporated by reference.

FIELD OF TECHNOLOGY

The following relates to a method for actuating a power semiconductor switch, to an actuation circuit for a power semiconductor switch and to an electronic circuit breaker.

BACKGROUND

When electronic loads, such as for example loads having switched-mode power supplies and/or rectifiers, are connected to an AC voltage supply, high switch-on currents arise, these also being referred to as inrush currents. Even in the case of switched-mode power supplies with a relatively low rated power, for example in the case of switched-mode power supplies with a rated power less than 100 W, it is possible for peak currents of several hundred amperes to arise. These inrush currents can lead to unwanted tripping of conventional miniature circuit breakers (MCBs).

A typical case of consumers with a low continuous power and high switch-on current are LED illuminants, which are increasingly superseding other illuminants in households and in building services engineering. LED illuminants for operation in a 230 V grid have, amongst other things, a power supply that exhibits a capacitive behavior at the moment of switch-on. In this case, in practice, many of these illuminants are often connected in parallel and are therefore switched on at the same time, as a result of which the switch-on current can be multiplied accordingly and can lead to overloading of the circuit and/or to unwanted tripping of the MCB.

In addition, the high loading caused by the switch-on current can also cause increased wear in conventional switching devices such as relays, contactors or switches, for example when the high switch-on current arises in combination with bouncing of a mechanical contact. The bouncing in connection with the high current can then lead to temporary electric arcs at the switching contacts, which in turn entail loss of contact material and corresponding wear of the switching element and, in extreme cases, cause the contacts to be welded together.

When modern semiconductor circuit breakers (SCCB for short, sometimes also solid-state circuit breaker, SSCB for short; the acronym SCCB is used in the following text), there is a further problem in that such an SCCB itself can be destroyed by excessive currents.

The entire circuit then has to be designed with conventional components so that the maximum switch-on current that arises does not lead to interference or overloading, which means in practice that all components of the circuit have to be designed for a multiple of the continuous load that is provided. This accordingly entails higher costs and also leads to the fact that the miniature circuit breaker does not protect the actual application defined by the continuous load that is provided but protects a compromise between the continuous load and the switch-on current. Although this compromise can be achieved relatively cost-effectively in conventional electromechanical MCBs by selecting the trigger characteristics of the MCB, there is still a compromise that the MCB is then not optimally designed for the respective application, that is to say in particular an MCB with a slower trigger characteristic is used, as a result of which higher residual currents can also arise in the event of a fault. In contrast, the use of SCCBs is in many cases not possible at all in terms of economics.

SUMMARY

An aspect relates to an improved method for actuating a power semiconductor switch and an improved actuation circuit for a power semiconductor switch and an improved electronic circuit breaker that are suitable for use in circuits with potentially very high switch-on currents.

Advantageous developments of the present invention are specified in the dependent claims.

One advantage of the invention can be considered that of excessive switch-on currents being suppressed by virtue of the circuit being interrupted temporarily when an excessive switch-on current is detected and subsequently being reactivated, where the period of time between deactivation and reactivation corresponds at most to a period. In this case, in many consumers of the type discussed at the beginning, the capacitive elements of the consumers can be pre-charged by way of the switch-on current surge that is limited terms of time by the method, with the result that the switch-on current is lower in the reactivation process. Reactivation takes place at a low(er) voltage value, for example at voltage values that arise in a time window around the zero crossing, the time window beginning at a phase angle of the voltage at −20° in relation to the next zero crossing of the voltage and ending at a phase angle of the voltage of +20° in relation to the next crossing of the voltage, such that the voltage values upon reactivation are less than approximately 35% of the AC voltage. In other configurations, smaller phase angles and thus lower voltages are selected, for example +/−15° around the zero crossing corresponding to approximately 25% of the peak voltage or +/−10° around the zero crossing corresponding to approximately 17% of the peak voltage. In particular configurations of the invention, the reactivation of the circuit takes place before the next zero crossing of the voltage, that is to say before the zero crossing that follows the deactivation. The switch-on current upon reactivation is additionally limited in this way.

If the capacitances that are present should not yet be sufficiently pre-charged, an excessive switch-on current is caused again and detected according to the invention, and the aforementioned steps are repeated until either an excessive switch-on current no longer occurs or it is determined after n repetitions of the method that the switch-on current is still too high and subsequently a consumer with an excessive capacitance, a short circuit or, worded generally, a fault is determined.

In other words, the present invention is used to reliably prevent excessive switch-on currents and, in contrast to in the conventional art, it is not necessary to design the entire circuit for high switch-on currents generated by permissible consumers. It is also not necessary to intentionally slow down circuit breaker devices, for example to use a circuit breaker device with C characteristics instead of a circuit breaker device with B characteristics in order to prevent erroneous tripping of the circuit breaker device when connecting a consumer that functions as intended and is permitted for the circuit. In this case, in exemplary embodiments, the switch-on current is limited centrally by way of the SCCB so that it is possible to dispense with special components for limiting the switch-on current such as DALI circuits and phase cutting controllers, as a result of which costs can be saved on the consumer side.

In addition, the method according to embodiments of the invention can be used to achieve a situation in which an SCCB can be used at all without there being the risk of destroying the SCCB due to excessive switch-on currents. At least in any case a given SCCB can be augmented by the method according to embodiments of the invention and, as a result, can be adapted to circuits comprising electrical consumers with a typically high switch-on current and low continuous current.

Overall, improved protection of the electrical consumers of the circuit and the entire electrical system is achieved. In this case, the method according to embodiments of the invention is scalable as desired and used in virtually any voltage and current ranges.

It is particularly advantageous that repetition of the deactivation and reactivation also permits loads with very high switch-on currents, for example rectifiers with very high link circuit capacitances, to be started up with limited currents. Only the number n of repetitions of the method has to be adapted accordingly.

It is also advantageous that, in modern SCCBs, the necessary measuring means for detecting the present values for current and voltage are already present or can be implemented with very little additional outlay. A controller is also usually provided already, which means it is often possible to implement embodiments of the present invention with hardware that is already present.

It is furthermore advantageous that consumers that are already connected to the circuit are not significantly affected by the deactivation and reactivation processes taking place within a single full-wave or, in exemplary embodiments, within a single half-wave. With respect to common household circuits, it can be assumed, for example, that any electrical consumer is immune to several temporary deactivation and reactivation processes already for reasons of interference resistance.

In contrast to in the case of conventional soft starters that are each assigned a motor, another important advantage of embodiments of the present invention can be considered that of no 1:1 relationship having to exist between consumers and the circuit for limiting the switch-on current, which entails cost advantages, for example. Instead, in typical applications, a circuit breaker that is controlled in accordance with embodiments of the invention is used to provide protection for a circuit with a plurality of consumers.

BRIEF DESCRIPTION

Some of the embodiments will be described in detail, with reference to the following figures, wherein like designations denote like members, wherein:

FIG. 3 shows an exemplary procedure of an exemplary embodiment of the method; and FIG. 4 shows an exemplary time profile of the current and voltage connection with the application of another exemplary embodiment of the method.

DETAILED DESCRIPTION

Figure 1:
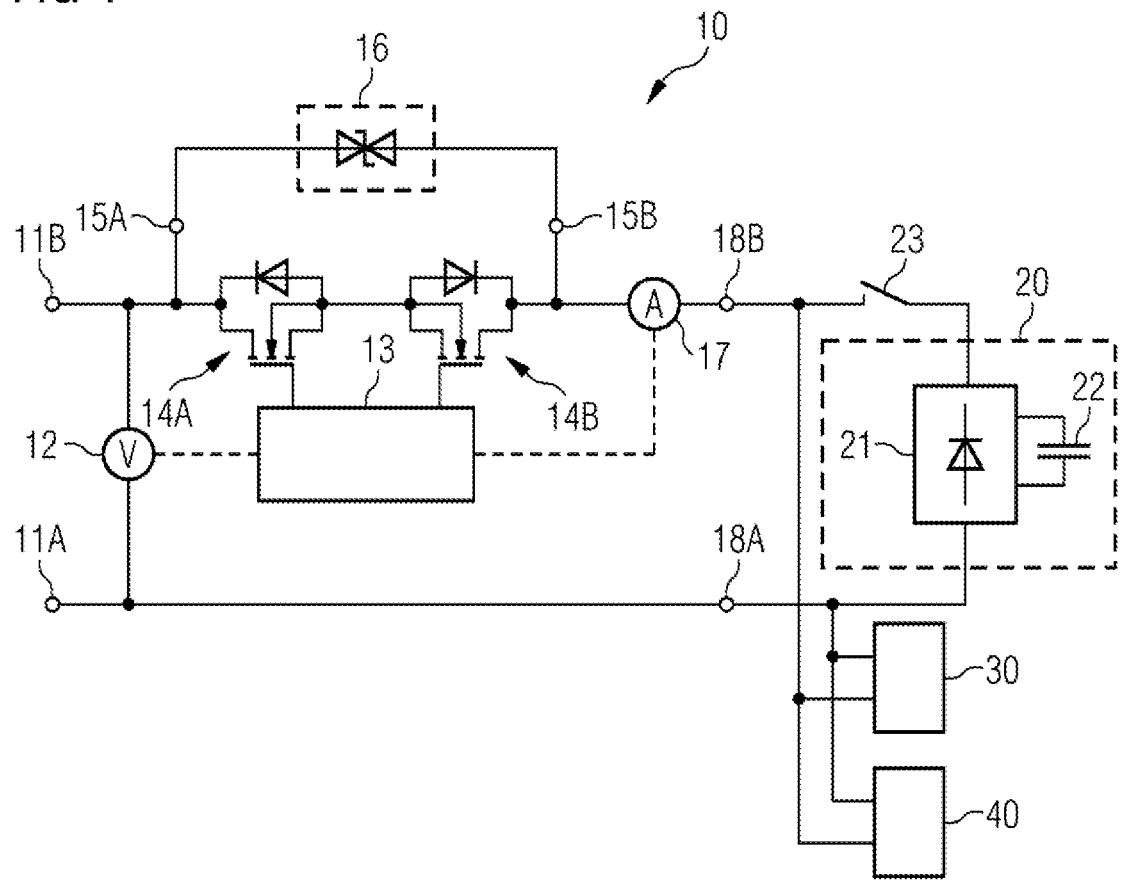
FIG. 1 shows a schematic illustration of a semiconductor miniature circuit breaker according to an exemplary embodiment of the present invention.

FIG. 1 shows a schematic illustration of a semiconductor miniature circuit breaker (in the following text: SCCB) 10 according to an exemplary embodiment of the present invention. The SCCB 10 has grid-side terminals 11A, 11B using which the SCCB 10 is able to be connected to a power supply grid (not illustrated). A first grid-side terminal 11A is used here for connection to the neutral conductor N, a second grid-side terminal 11B is used for connection to the phase conductor L.

A voltage measuring device 12 is used to measure the voltage on the input side of the SCCB 10. The voltage values ascertained by the voltage measuring device 12 are fed to a controller 13 (illustrated by a dashed line). In this case, the voltage measuring device 12 can be designed so that a signal that represents the voltage between the input-side terminals 11A and 11B is fed continuously in analog form to the controller 13. In alternative configurations, the voltage between the input-side terminals 11A and 11B is sampled by the voltage measuring device 12 at discrete times and supplied to the controller 13 as a time-discrete digital signal, wherein the sampling frequency is selected in relation to the grid frequency so that the controller 13 can ascertain from the signal sequence the time profile of the voltage applied to the input-side terminals 11A, 11B, in particular the times of the zero crossings, where appropriate by interpolation.

The neutral conductor connected to the first grid-side terminal 11A is connected directly to a first output-side or consumer-side terminal 18A of the SCCB 10. The phase L applied to the second grid-side terminal 11B is connected to a second output-side or consumer-side terminal 18B by a power semiconductor circuit 14A, 14B. In the example of FIG. 1, the power semiconductor circuit has two self-commutated power semiconductor switches 14A, 14B, which are controlled by the controller 13 and connect the phase L through to the second output-side or consumer-side terminal 18B or deactivate the connection between the second grid-side terminal 11B and the second consumer-side terminal 18B. In exemplary embodiments of the invention, power semiconductors that are connected in parallel can also be used (not illustrated).

In the example of FIG. 1, an energy absorber 16 is connected in parallel with the power semiconductor circuit 14A, 14B, the energy absorber being connected between a grid-side bypass terminal 15A and a load-side bypass terminal 15B and being used to limit the voltage and thus to protect the power semiconductor circuit in the case of particular switching events.

A current measuring device 17 is arranged in the phase conductor between the power semiconductor circuit 14A, 14B and the second consumer-side terminal 18B and is used to measure the load current in the phase conductor. In this case, the current measuring device 17 can be designed so that a signal that represents the current flowing in the phase conductor is fed continuously in analog form to the controller 13 (indicated by the dashed line between the current measuring device 17 and the controller 13). In alternative configurations, the current is detected by the current measuring device 17 at discrete times and supplied as a time-discrete digital signal to the controller 13, wherein the sampling frequency is selected to be so high that, for example, a greatly increasing current profile, caused by a short circuit, for the respective application can be detected in good time and converted into appropriate actions.

Three electrical consumers 20, 30, 40 are connected to the load-side terminal 18A, 18B of the SCCB 10. Consumers 30 and 40 are any desired consumers, these being illustrated only to indicate that the method described further below for limiting the switch-on current of the consumer 20 can also be carried out when other consumers 30, 40 are already active in the respective circuit that is protected by the SCCB 10 before the consumer 20 is activated, which corresponds to a typical practical application.

In the example of FIG. 1, the consumer 20 is a consumer of the type described at the beginning, that is to say a consumer with a low continuous power and a high switch-on current, for example an LED lighting system of a relatively large room comprising a plurality of individual LED illuminants. This is indicated by a rectifier 21 and a capacitive load 22. In exemplary embodiments of the invention, both the rectifier 21 and the capacitive load are representative of a plurality of parallel-connected rectifiers and capacitive loads, as is the case, for example, in an LED lighting system in a large hall. The consumer 20 can be activated or deactivated by a switch 23. The switch 23 can in this case be a mechanical wall-mounted switch that can be operated by a user or else an electronically controlled switch.

Figure 2:
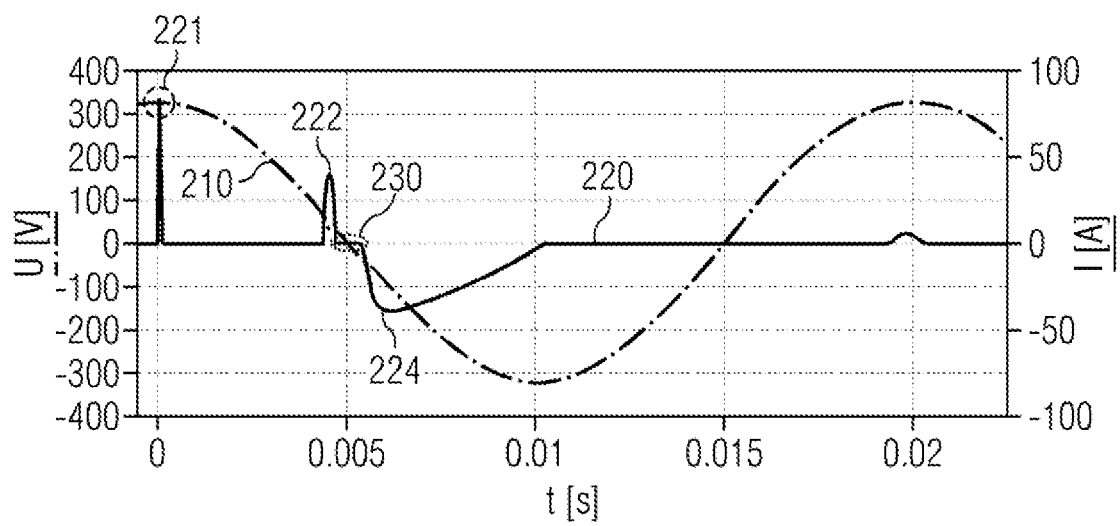
FIG. 2 shows an exemplary time profile of the current and voltage in connection with the application of an exemplary embodiment of the method.

A first variant of the method according to embodiments of the invention is explained in the following text in connection with FIG. 2. FIG. 2 shows in a single graph an exemplary time profile 220 of the current I detected by the current measuring device 17 (right-side scale axis of the graph) and an exemplary time profile 210 of the voltage U detected by the voltage measuring device 12 (left-side scale axis). The situation for a 230 V low-voltage grid is shown purely by way of example, in which the peak voltage at the time t=0 of an individual phase L with respect to the neutral conductor N is approximately 325 V.

The consumer 20 that causes a very high switch-on current 221 is connected at the time t=0. This current is ascertained by the current measuring device 17 and processed by the controller 13. In this exemplary embodiment, the controller 13 is set up so that currents above 80 A are not permitted. The controller 13 thus controls the power semiconductor circuit when a current value of 80 A is reached so that it blocks, that is to say the flow of current in the phase conductor L between the input terminal 11B and the output terminal 18B is interrupted, after which the current and also the current measurement value drops to zero.

Next, shortly before reaching the zero crossing of the sinusoidal (grid) voltage U at t=0.005 s, the power semiconductor circuit is switched on by the controller 13, after which the measurement value of the current again has a great increase 222, which, however, is already flatter than at t=0 since the capacitances of the consumer 20 are already partly charged and/or since the present voltage value is low and also has a falling trend and thus the increase and maximum value of the current are limited independently of the consumer 20.

If the consumer 20 is a consumer that has capacitive elements 22 as indicated in FIG. 1, a zero current phase 230 brought about by the already partly charged capacitances generally occurs around the voltage zero crossing. This fact and the term "zero current phase" are explained in more detail further below.

After the zero crossing of the voltage (characterized in this case by entry into the negative half-wave) and at the end of the zero current phase 230, the current increases again to a value 224 that is significantly higher than the normal value for the corresponding circuit but no longer reaches the tripping value of 80 A and still returns to the low continuous current value of, for example, a few hundred milliamperes of the consumer 20 during the negative half-wave grid voltage, wherein the continuous current value in FIG. 2 cannot be distinguished from the current value I=0 due to the scale selected.

The controller 13 decides that no short circuit has taken place based on the fact that the current has not yet reached the limit value of 80 A again after reactivation shortly before the zero crossing of the voltage. The operation of the SCCB 10 is continued with the monitoring of the current.

In an exemplary embodiment of the present invention, the time for reactivating the power semiconductor circuit described above by "shortly before reaching the zero crossing" can be selected as the time at which the phase angle of the sinusoidal grid voltage, that is to say at the input terminals 11A, 11B of the SCCB 10, is between 160° and 170° or between 340° and 350°, depending on whether the interruption of the circuit by the controller took place during the positive or during the negative half-wave of the grid voltage.

In exemplary embodiments of the present invention, the zero current phase can be used to distinguish a short circuit from a switch-on process. Since a characteristic current/time profile and practically no zero current phase typically occur in a short circuit because a short circuit exhibits a resistive behavior, that is to say the current/time profile has high values for the current and closely resembles the voltage/time profile. Otherwise, there is the case for a switch-on process of a consumer 20 that has capacitive elements and causes a very high switch-on current 221: in this case, the expected current/time profile around the zero crossing of the voltage is characterized by low current values that may be zero if otherwise known consumers are connected in the circuit- hence the reference "zero current phase" used here for simplification.

FIG. 3 illustrates the sequence of an exemplary embodiment of the method according to the invention described above in connection with FIG. 2. The method starts with an initialization step 310 that provides a maximum current value, for example by reading out from a memory, and provides same for the monitoring step 320.

In the monitoring step 320, the present current value is compared with the maximum current value. If the present current value does not exceed the maximum current value, then the power semiconductor circuit 14A, 14B remains activated, step 330, and the method is continued with step 320.

In contrast, if the present current value corresponds to or exceeds the maximum current value, then the power semiconductor circuit 14A, 14B is deactivated, step 340, and in step 350 it is checked whether the case of a short circuit or fault can be identified already because, for example, a counter (not illustrated) that is incremented in step 340 exceeds a particular value n.

If it is determined in step 350 that there is a short circuit or a fault, the method ends with step 370 and the power semiconductor circuit 14A, 14B remains deactivated until, for example, the short circuit has been eliminated and is reactivated manually (not illustrated). In exemplary embodiments of the present invention, whenever the fault event or the short-circuit event is determined, an isolating switch arranged in series with the power semiconductor switch can also be deactivated (not illustrated). Said isolating switch is arranged on the grid side of the power semiconductor switch in the conductor L1 but can also be arranged on the load side of the power semiconductor switch. In this case, it is possible to use single-pole or two-pole isolating switches.

If it is determined in step 350 that the conditions for determining a short circuit or fault are not met, the power semiconductor circuit 14A, 14B is reactivated in step 360, wherein the remarks made with respect to FIG. 2 apply to the time of reactivation.

When returning back to the monitoring step 320 from step 360, provision may additionally be made for another, for example a lower, maximum current value instead of the previous maximum current value. In addition or as an alternative, when returning back to the monitoring step 320 from step 360, provision may be made for the presence of a zero current phase as explained in connection with FIG. 2 to be monitored and a short circuit or fault to be identified and for the method to be terminated when no zero current phase arises (not illustrated).

Another variant of the method according to embodiments of the invention is explained in the following text in connection with FIG. 4. FIG. 4 shows (like FIG. 2) in a single graph an exemplary time profile 220A of the current I that is detected by the current measuring device 17 (right-hand scale axis of the graph) and an exemplary time profile 210 of the voltage U that is detected by the voltage measuring device 12 (left-hand scale axis of the graph). The situation for a 230 V/400 V low-voltage grid is shown again purely by way of example, in which the peak voltage of an individual phase L with respect to the neutral conductor N is approximately 325 V.

The consumer 20 that causes a very high switch-on current 221 is again connected at the time t=0.005 s. This current is ascertained by the current measuring device 17 and processed by the controller 13. In this exemplary embodiment, the controller 13 is set up so that first of all currents over 50 A are not permitted. The controller 13 thus controls the power semiconductor circuit when a current value of 50 A is reached so that it blocks, that is to say the flow of current in the phase conductor is interrupted, after which the measurement value for the current drops to zero.

The control signals that are output at the power semiconductor circuit are illustrated as a digital signal sequence 240 at the bottom edge of the graph in FIG. 4. An ON signal is illustrated from t=0 to t=0.005 s, an OFF signal is illustrated from t=0.005 s to shortly before t=0.01 s, then a very short ON signal followed by a very short OFF signal, followed by an ON signal at approximately t=0.01 s, etc.

As is clear from the signal sequence 240, the power semiconductor circuit is switched on (first reactivation) by the controller 13 shortly before reaching the zero crossing of the sinusoidal voltage U at t=0.01 s, after which the current and the measurement value thereof again exhibit a great increase 222 and again increase to over 50 A. The controller 13 thus controls the power semiconductor circuit again so that it blocks, that is to say the flow of current in the phase conductor is interrupted, after which the current and the measurement value thereof return to zero.

In one configuration of embodiments of the invention, the controller 13 can then immediately turn on the power semiconductor circuit again, always just shortly before or else during the zero crossing of the voltage U (second reactivation), after which, due to the diodes in the rectifier 21 and/or the capacitance 22 that is already partly charged, another current increase 224 does not occur until the magnitude of the voltage exceeds the threshold voltage of the diodes in the rectifier and/or the voltage of the capacitances that are already partly charged.

The current also exceeds a maximum value after the second reactivation at point 224, wherein, in the exemplary embodiment illustrated, the maximum value for the second reactivation has been selected to be lower than the maximum value for the first reactivation and is 40 A, for example.

Due to the now valid maximum value being exceeded, the controller 13 controls the power semiconductor circuit again so that it blocks, that is to say the flow of current in the phase conductor is interrupted, after which the current and the measurement value thereof return to zero.

Activation (third reactivation) takes place again at the end of the (negative) half-wave of the voltage U by the controller 13 switching on the power semiconductor circuit. In this case, the same time interval before reaching the voltage zero crossing can be selected as in the first reactivation or it may be selected to be a somewhat later time, closer in time to the zero crossing of the voltage, for the third reactivation.

The current increases greatly again, point 225, but does not exceed the maximum value, for which reason the controller 13 leaves the power semiconductor circuit switched on. However, the current after the zero crossing at the end of a zero current phase 231 at point 226 exceeds the maximum value of 40 A again, after which the controller 13 actuates the power semiconductor circuit again so that it blocks, that is to say the flow of current in the phase conductor is interrupted, after which the current and the measurement value thereof return to zero.

Activation (fourth reactivation) takes place again at the end of the (positive) half-wave of the voltage U by the controller 13 switching on the power semiconductor circuit. In this case, the same time interval before reaching the voltage zero crossing can be selected as in the third reactivation or it may be selected to be a somewhat later time, closer in time to the zero crossing of the voltage, for the fourth reactivation, or it may also be a somewhat earlier time, further away in time from the zero crossing of the voltage, for the fourth reactivation.

In the example of FIG. 4, no current increase results directly with the fourth reactivation shortly before t=0.03 s because the switch-on time falls in a zero current phase 232 caused by the already partly reached charge of the capacitance 22 of the consumer 20.

The current at point 227 exceeds the maximum value of 40 A again after the zero crossing and at the end of the zero current phase 232, after which the controller 13 actuates the power semiconductor circuit again so that it blocks, that is to say the flow of current in the phase conductor is interrupted, after which the current and the measurement value thereof return to zero.

Activation (fifth reactivation) takes place again at the end of the (negative) half-wave of the voltage U by the controller 13 switching on the power semiconductor circuit.

In the example of FIG. 4, no current increase results directly with the fifth reactivation shortly before t=0.04 s because the switch-on time again falls in a zero current phase 233 caused by the already partly reached charge of the capacitance 22 of the consumer 20.

The current at point 228 increases greatly again but does not exceed the maximum value of 40 A after the zero crossing and at the end of the zero current phase 233. Therefore, the controller 13 leaves the power semiconductor circuit in the activated state and continues the method with the monitoring of the current, wherein the original maximum value of 50 A is used instead of the modified maximum value of 40 A either directly or after a definable time has elapsed.

In general terms, the method consisting of the steps of activating and reactivating the power semiconductor can be repeated up to n times. If the case that the current no longer exceeds the maximum value occurs before reaching the n-th repetition, the controller determines a normal reactivation process. If this is not the case, that is to say the maximum value for the current is thus also exceeded at the n-th repetition of the method, the method is terminated and a fault case is determined and, where necessary, this is signaled to an operator.

As already explained above using the example, the maximum value can be constant for each reactivation or can be newly determined for each reactivation, for example can be reduced, in order to limit the $I^2t$ loading of the entire system. Furthermore, the time for the reactivation with respect to the zero crossing can be varied, for example by setting the time for the reactivation with each repetition to be closer to the zero crossing in order to achieve a lower switch-on current purely based on the then lower absolute magnitude of the voltage, the lower switch-on current still charging the consumer-side capacitances, in particular the link circuit capacitances of the rectifier, or in order to shift the reactivation into the zero current phase expected for rectifier consumers and to determine the event of a short circuit when unexpectedly high currents arise in this phase.

The value n for the number of repetitions is determined, among other things, by which other consumers 30, 40 are connected to the circuit that is protected by the SCCB 10 and in particular by how many half-waves may fail without malfunctions or damage occurring at the other consumers. This may result from standards that apply to the respective circuit or may be decided on a case-by-case basis based on the typically connected consumers.

In the example of FIG. 4, n=5 has been selected. In other exemplary embodiments n≤5 and in still other exemplary embodiments n≤10. The number n can in this case depend not only on the type of consumer, as explained above, but also on the total load, caused by the other active consumers 30, 40, that is already present in the circuit in the specific case. The maximum current value can also be made to be dependent on this load that is already present, in particular the initial maximum current value and all other maximum current values can be selected to be lower than the standard maximum current value when a load is already present in the circuit, in particular when this present load is for example over 50% or over 75% or over 90% of the rated load or the permissible continuous current of the circuit.

In exemplary embodiments of the invention, provision may be made, when a fault has been identified, for the circuit to be activated again automatically after a configurable waiting time that may be several milliseconds to seconds or several seconds to minutes has elapsed and, based on the method described above that then continues to proceed, for it to be ascertained whether the fault is still present or has been resolved, for example in the event of a thermally induced temporary malfunction of a consumer.

This may be implemented, for example, as follows: as the method described above proceeds, it is ascertained for each reactivation whether the subsequently arising current peak 222, 224, 226, 227, 228 is a switch-on current or a short-circuit current, for example based on the criterion of whether or not a zero current phase can be determined around the zero crossing. If a switch-on current event is identified, a counter inr_cnt is incremented. If a short-circuit event is identified, a counter sc_cnt is incremented.

These counters are continuously compared with limit values. If inr_cnt>n, there is no more reactivation, as described above, wherein the counter inr_cnt is decremented again in steps after a specifiable time until it has reached its starting value, for example zero. The specifiable time may be, for example, a grid period, that is to say 20 ms in the case of European household grids, or else several grid periods up to several seconds.

In addition, the counter sc_cnt can be compared with another limit value k and reactivation is suppressed after a short-circuit current event or fault event only when sc_cnt>k, with the result that events classified as short-circuit current events do not directly lead to the determination of a fault but a fault is determined and output only when more than k short-circuit current events have been detected.

In this case, it is possible to select k=0, that is to say even the first short-circuit current events leads to the determination of a fault, or it is possible to select k>0, 0≤k<n. For the counter sc_cnt, it is also possible to determine that it is decremented again in steps after a specifiable time until it has reached its starting value, for example zero. This specifiable time can also be, for example, a period or it may be selected to be longer than the specifiable time after which the counter inr_cnt is decremented. The specifiable time that is waited for the counter sc_cnt that is decremented again in steps is several seconds and, in particular exemplary embodiments, is even minutes.

The reduction of the maximum value of the current at which the power semiconductor circuit is deactivated, as already explained, may in this case be coupled to the values of the counter inr_cnt and/or sc_cnt, for example by reducing the maximum value with each increment of one of these values or by reducing the maximum value in few stages, for example when inr_cnt=2 is reached for the first time and when inr_cnt=4 is reached again.

It should be noted that, in the above description of exemplary embodiments, the current consumption of the consumers 30, 40 that are already connected before the further consumer 20 is connected has been assumed to be low for reasons of simplification and this therefore cannot be distinguished from I=0 in FIG. 2 and FIG. 4. The period of time in which the consumer 20 that is provided with a rectifier and that is to be connected does not consume any current due to not reaching the forward voltage of the rectifier diodes is referred to as "zero current phase" for reasons of simplification. The term "zero current phase" generally means the period of time in which the situation in the circuit illustrated in FIG. 1 is not influenced by switch-on processes of the newly connected consumer 20, that is to say typically the period of time in which the consumer 20 does not cause any or any significant additional current flow, for example because the capacitances 22 are already partly charged.

The last example is to be understood as follows: if a consumer 21 with a rectifier and parasitic capacitances or useful capacitances 22 is connected in the DC circuit via the switch 23, then these capacitances, as already explained, are at least partly charged by the current pulse until disconnection by the controller 13 and keep this voltage entirely or partly for the short period of time until the power semiconductor circuit is activated again at the latest at the end of the present half-wave of the voltage.

Due to this partial charging of the capacitances, after reactivation, a current begins to flow in the consumer 20 only when the present value of the voltage on the load side of the SCCB 10 exceeds the value of the voltage applied to the DC voltage side of the rectifier 21 plus the threshold voltage of the diodes located in the current path. Looking at it the other way round, the zero current phase thus results from the fact that, in already on a voltage of the capacitances 22 that is defined by the preceding current pulse(s), as long as no charge flows, how the present value of the voltage fed into the consumer 20 is lower than said defined voltage. Of course, this can also be expressed easily as a phase angle or time interval by the sinusoidal relationship of the voltage profile; see further below for details regarding this.

In particular exemplary embodiments of the present invention, said defined voltage value can be determined at least approximately by measuring the voltage between the load-side terminal 18A, 18B or based on such a measurement as a comparison criterion. In other exemplary embodiments, the defined voltage value can be determined based on an estimation, in particular based on an estimation on the basis of the number of reactivation processes. In this case, the regular switch-on behavior (for example profile of current, voltage and number of reactivation cycles required) can more typically be based on consumers 20 that can be connected to the specific AC circuit.

In exemplary embodiments of the invention, for the short-circuit or fault identification, the current/time profile can also be evaluated in the expected zero current phase or the zero current phase as defined above, that is to say immediately before and immediately after the zero crossing of the present voltage value. In this case, the present time profile of the current is compared with the current/time profile. Said expected current/time profile may be, for example, the current/time profile of a short circuit or an impermissibly high load, and the short circuit or fault is identified when the actual current/time profile corresponds at least approximately to such a short-circuit profile or impermissible overload profile.

In other exemplary embodiments, the present time profile of the current is compared with a current/time profile that is expected when there is no short circuit or no case of impermissible overload. Such a setpoint current/time profile can be specified for a specific AC circuit through configuration and, for example, can correspond to the current/time profile of the circuit that is loaded at the rated load thereof.

As an alternative or in addition, the setpoint current/time profile can be selected as the current/time profile that was regularly present before the first determination of a specifiable maximum value being exceeded, that is to say for example before the first switch-on current event or short-circuit current event 221. "Regularly" at this point means the "regular case" that can be determined in various ways. For example, the time profile of the current between a selectable phase angle of the voltage before the zero crossing thereof, for example −10°, up to a selectable phase angle of the voltage after the zero crossing thereof, for example +10°, can be stored anew as reference for each zero crossing.

This reference is used when the switch-on current event or short-circuit current event has been detected in order to compare the zero current phase after this event with the reference and, in the case of a deviation that exceeds a particular tolerance, to determine that a short-circuit current event is present and, otherwise, that is to say when the present profile and the reference deviate from one another by less than a particular tolerance, to determine that a switch-current event is present.

The phase angles mentioned are selected so that the absolute values of the voltage are suitable for charging the (possibly already pre-charged) capacitances in the consumer that is to be newly connected, that is to say higher by a particular magnitude than the already achieved voltage of said capacitances, the voltage in turn being able to be derived from the previous profile of the switch-on process, for example. In exemplary embodiments, in particular those at a grid frequency of 50 Hz, the zero current phase is defined as a period of time of 0.5 milliseconds around the zero crossing of the voltage, wherein this period of time is placed around the zero crossing symmetrically, that is to say it begins 0.25 milliseconds before the zero crossing and ends 0.25 milliseconds after the zero crossing. In other exemplary embodiments or in the case of repetitions of the reactivation, for example from the second or third repetition, this period of time can be selected to be longer in order to provide a higher voltage for the further charging of the already partly pre-charged capacitances. For example, a zero current phase of 1 millisecond can be selected and placed symmetrically around the zero crossing, that is to say begins 0.5 milliseconds before the zero crossing according to a magnitude of the voltage value of approximately 50 V and ends 0.5 milliseconds after the zero crossing.

Expressed in the form of equations, the zero current phase can also be described as follows: $abs(I(t)) \leq I\_Lim(t)$. Here, $I(t)$ means the value of the current in the SCCB 10 ascertained by the current measuring device 17, $I\_Lim(t)$ means the current expected during the zero current phase and $abs(\ )$ means the magnitude. $I\_Lim(t)$ may be constant, that is to say independent of t. In general, $I\_Lim(t)$ describes the expected time profile of the current in the observed time window around the zero crossing. In this case, a tolerance of for example 10% or 20% or 25% or 50% of the actually expected value can also be taken into account.

In other exemplary embodiments, a constant limit value can be used, to which a time-dependent value in proportion with the grid voltage is added, that is to say for example $I\_Lim(t)=I\_const+I\_dyn(t)$, wherein $I\_const$ is the constant limit value and $I\_dyn(t)$ is the time-dependent value. In this case, it is possible to select $I\_dyn(t)=U(t)/R\_cur$, wherein $U(t)$ is the present value of the voltage and $R\_cur$ is the ohmic resistance of a presently connected ohmic load, for example ohmic consumer 30, 40. The value ascertained by the voltage measuring device 12 can readily be used for $U(t)$, or an additional load-side voltage measuring device is used (not illustrated).

In addition or as an alternative to the above-described methods for distinguishing a switch-on current event from a short-circuit current event, the increase in the current/time profile can also be compared with a maximum or reference value in order to distinguish a switch-on current event from a short-circuit current event. This is expedient in particular in later reactivation processes in implementations in which several repetitions of activation and deactivation processes are permitted, for example n=5. A capacitive load is charged somewhat with each reactivation process, such that as the number of reactivation processes increases, a somewhat lower increase in the current/time profile can be assumed, while the same increase can always be expected in the case of a short circuit.

In one development, this consideration is extended to the curve shape of the current/time profile between reactivation of the power semiconductor circuit and the immediately following disconnection due to the maximum value being exceeded. In this case, the curve shape of the current/time profile is compared with a specifiable fault curve shape. A fault/short-circuit event is then identified when the curve shape of the current/time profile runs at least predominantly above the fault curve shape. Otherwise, a switch-on current event is identified.

It should be noted that the exemplary embodiments described above can be combined with one another as desired. It should also be noted that particularly the case of a single-phase low-voltage circuit in a three-phase 400 V/50 Hz supply grid has been considered above. Based on the above disclosure, a person skilled in the art will find variants and applications of embodiments of the invention described above without exercising inventive skill, for example the application of embodiments of the invention to other voltages and/or frequencies and/or to any circuits in the three-phase system, for example for circuits connected between two phases L1, L2.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

The invention claimed is:

1. A method for actuating a power semiconductor switch of an AC circuit that can be activated or deactivated by the power semiconductor switch, the method comprising:
   a) ascertaining a present current value and a present voltage value of the AC circuit;
   b) ascertaining whether the present current value exceeds a specifiable maximum value and if so,
       c1) generating a deactivation signal for deactivating the circuit;
       c2) generating an actuation signal for activating the circuit within a period of time after generating the deactivation signal for deactivating the circuit, wherein the period of time is less than or equal to the period of the voltage;
       c3) ascertaining whether the present current value exceeds a next specifiable maximum value, which corresponds to the previous maximum value or is less than the previous maximum value, after activating the circuit, and either
       c4a) ascertaining whether a current/time profile at least approximately corresponds to an expected current/time profile of a short circuit immediately before and immediately after the next zero crossing of the present voltage value, or
       c4b) ascertaining whether the current/time profile does not at least approximately correspond to an expected current/time profile immediately before and immediately after the next zero crossing of the present voltage value, and
       c5) repeating steps c1), c2), c3), c4a) or c4b), and c5) if the condition of step c3) is met and the condition of step c4a) is not met or the condition of step c4b) is not met;
   d) identifying a fault case and permanently outputting the deactivation signal in order to disconnect the circuit, and terminating the method if the number of repetitions of steps c1), c2), c3), c4a) or c4b), c5) exceeds a value n and/or if the condition c4a or c4b is met;
   e) continuing to generate the actuation signal for activating the circuit if it was ascertained in step b) that the present current value undershoots the specifiable maximum value or if it was ascertained in step c5) that the condition of step c3) is not met, and continuing the method with step a).

2. The method as claimed in claim 1, in which, in step c3), the actuation signal for activating the circuit is generated before the next zero crossing of the voltage and/or within a time window that begins at a phase angle of the voltage at −20° in relation to the next zero crossing of the voltage and ends at a phase angle of the voltage of +20° in relation to the next zero crossing of the voltage.

3. The method as claimed in claim 1, in which, in step c3), an increase in a current/time profile is also ascertained in addition to the present current value, wherein the increase is compared with a specifiable maximum value and wherein the method is terminated, the fault case is identified and the deactivation signal for deactivating the circuit is permanently output if the increase is above the maximum value.

4. The method as claimed in claim 3, in which, instead of the increase, a curve shape of the current/time profile is ascertained, the curve shape being compared with a specifiable fault curve shape, wherein the method is terminated, the fault case is identified and the deactivation signal for deactivating the circuit is permanently output if the curve shape of the current/time profile runs at least predominantly above the fault curve shape.

5. The method as claimed in claim 1, in which the current/time profile that was regularly present before the first time it was determined in step b) that a specifiable maximum value was exceeded is used as the expected current/time profile.

6. The method as claimed in claim 1, in which the current/time profile is evaluated in a time window around the zero crossing of the present voltage value, the time window being defined by the magnitude of the present voltage being below a predefined value in the time window.

7. The method as claimed in claim 6, in which the predefined value at least approximately corresponds to the voltage that is present on the DC-voltage side of a rectifier of a consumer that is to be connected to the AC circuit.

8. The method as claimed in claim 6, in which the predefined value is determined based on a measurement of a voltage at a load-side terminal of the power semiconductor switch or based on an estimation, in particular based on an estimation on the basis of the number of repetitions of steps c1), c2) and c3) already carried out for consumers that can typically be connected to the AC circuit.

9. The method as claimed in claim 1, in which, in step c2), the actuation signal for activating the circuit is generated so that the circuit is activated at a specifiable or specified phase angle of the voltage, in particular at a phase angle of the voltage of 10°-20° before the next zero crossing.

10. An actuation circuit for a power semiconductor switch of an AC circuit comprising means for carrying out the method as claimed in claim 1.

11. An electronic circuit breaker for an AC circuit, the electronic circuit breaker comprising the following:
   a power semiconductor switch, in particular a self-commutated power semiconductor switch for activating and/or deactivating the AC circuit,
   current measuring means for ascertaining a present current value of a current flowing in the AC circuit;
   voltage measuring means for ascertaining a present voltage value of the AC circuit with respect to a reference potential;
   an actuation circuit as claimed in claim 10 that controls the power semiconductor switch.

12. The electronic circuit breaker as claimed in claim 11, additionally having an electromechanical isolating contact arranged in series with the power semiconductor switch and also having means for opening the isolating contact if a fault event has been identified.

* * * * *